US012648409B2

(12) United States Patent
Gao et al.

(10) Patent No.: US 12,648,409 B2
(45) Date of Patent: Jun. 2, 2026

(54) WAFER CARRYING APPARATUS AND SEMICONDUCTOR PROCESS DEVICE

(71) Applicant: BEIJING NAURA MICROELECTRONICS EQUIPMENT CO., LTD., Beijing (CN)

(72) Inventors: Rui Gao, Beijing (CN); Yanjie Jiang, Beijing (CN)

(73) Assignee: BEIJING NAURA MICROELECTRONICS EQUIPMENT CO., LTD., Beijing (CN)

( * ) Notice: Subject to any disclaimer, the term of this patent is extended or adjusted under 35 U.S.C. 154(b) by 0 days.

(21) Appl. No.: 18/875,555

(22) PCT Filed: Jun. 29, 2023

(86) PCT No.: PCT/CN2023/103712
§ 371 (c)(1),
(2) Date: Dec. 16, 2024

(87) PCT Pub. No.: WO2024/002219
PCT Pub. Date: Jan. 4, 2024

(65) Prior Publication Data
US 2026/0005063 A1 Jan. 1, 2026

(30) Foreign Application Priority Data

Jul. 1, 2022 (CN) .......................... 202210766411.6

(51) Int. Cl.
*B25B 11/00* (2006.01)
*H01J 37/32* (2006.01)
(Continued)

(52) U.S. Cl.
CPC .... *H10P 72/7612* (2026.01); *H01J 37/32642* (2013.01); *H01J 37/32715* (2013.01);
(Continued)

(58) Field of Classification Search
CPC .... B24B 7/04; B24B 7/07; B23Q 3/00; B23Q 3/06; B23Q 3/18; B25B 11/00; B25B 11/02
See application file for complete search history.

(56) References Cited

U.S. PATENT DOCUMENTS

| | | | |
|---|---|---|---|
| 5,876,265 A * | 3/1999 | Kojima | B24B 37/042 |
| | | | 438/692 |
| 2002/0037681 A1* | 3/2002 | Gitis | G01B 17/08 |
| | | | 451/287 |

(Continued)

FOREIGN PATENT DOCUMENTS

| | | |
|---|---|---|
| CN | 105206558 A | 12/2015 |
| CN | 112397366 A | 2/2021 |

(Continued)

OTHER PUBLICATIONS

The World Intellectual Property Organization (WIPO) International Search Report for PCT/CN2023/103712 Aug. 23, 2023 7 Pages (including translation).

*Primary Examiner* — Lee D Wilson
(74) *Attorney, Agent, or Firm* — ANOVA LAW GROUP, PLLC

(57) ABSTRACT

A wafer carrying apparatus includes a base; an edge protection ring assembly; a first detection assembly; and a drive assembly. The base is used to carry a wafer and includes a cavity internally, the edge protection ring assembly includes an edge protection ring, a protection ring support, and a plurality of protection ring connection rods, the edge protection ring is arranged above the base, the protection ring support is arranged below the base at intervals, and the (Continued)

plurality of protection ring connection rods are connected between the protection ring support and the edge protection ring. The drive assembly is arranged in the cavity and connected to the protection ring support, the drive assembly is used to drive the protection ring support to drive the edge protection ring to move between a wafer transfer position and a process position in a vertical direction through the plurality of protection ring connection rods.

12 Claims, 11 Drawing Sheets

(51) Int. Cl.
    *H10P 72/50*    (2026.01)
    *H10P 72/76*    (2026.01)

(52) U.S. Cl.
    CPC .......... *H10P 72/50* (2026.01); *H10P 72/7611* (2026.01); *H01J 2237/2007* (2013.01)

(56) References Cited

U.S. PATENT DOCUMENTS

| | | | |
|---|---|---|---|
| 2009/0191499 A1 | 7/2009 | Surthi et al. | |
| 2009/0203299 A1* | 8/2009 | Kashiwa | B24B 7/228 |
| | | | 451/285 |
| 2020/0348335 A1 | 11/2020 | Park et al. | |
| 2023/0126644 A1* | 4/2023 | Mori | B24B 7/16 |
| | | | 451/8 |
| 2024/0001489 A1* | 1/2024 | Zhu | B23K 26/032 |
| 2024/0157493 A1* | 5/2024 | Watanabe | B23Q 5/261 |

FOREIGN PATENT DOCUMENTS

| | | |
|---|---|---|
| CN | 214898369 U | 11/2021 |
| CN | 113972124 A | 1/2022 |
| CN | 114927461 A | 8/2022 |
| KR | 20200024106 A | 3/2020 |
| TW | 202220097 A | 5/2022 |

* cited by examiner

WAFER CARRYING APPARATUS AND SEMICONDUCTOR PROCESS DEVICE

CROSS-REFERENCE TO RELATED APPLICATIONS

This application is a national phase entry of PCT Patent Application No. PCT/CN2023/103712, filed on Jun. 29, 2023, which claims the priority of Chinese Patent application Ser. No. 20/221,0766411.6, filed on Jul. 1, 2022, the entire contents of all of which are incorporated herein by reference.

TECHNICAL FIELD

The present disclosure relates to the technical field of semiconductor process technologies and, more particularly, to a wafer carrying apparatus and a semiconductor process device.

BACKGROUND

In the semiconductor field, a special semiconductor process device, such as an etching machine, is often needed to perform an etching process. The etching machine usually includes an upper electrode, a lower electrode, a process chamber, and other necessary structures. The positioning accuracy in the wafer transfer process is determined by the stability of a needle lifting mechanism of the lower electrode in the process chamber, which plays a key role in the process results. In an etching process, edge protection rings are often used to prevent the edges of a wafer from being etched, that is, to avoid the over-etching problem. Currently, the needle lifting mechanism and the protection ring in the process chamber adopt a mechanical linkage method, that is, a same drive mechanism is used to achieve the transmission sequence of a top needle and the edge protection ring starting to rise and stop falling at different times, thereby improving the operation efficiency and safety.

However, when the needle lifting mechanism and the edge protection ring are mechanically linked, the edge protection ring can only stop at a fixed position. Therefore, after an ejector needle transfers the wafer to an electrostatic chuck, the position of the edge protection ring will also be fixed. At this point, a gap between the edge protection ring and the wafer is also fixed. The amount of the gap directly affects the electric field and flow field distribution of the plasma inside the process chamber. If the gap is too wide, the gap between the edge protection ring and the wafer will be too large. During the etching process, the plasma will enter the gap, and the problem of over-etching the wafer edge will still occur. If the gap is too narrow, an inclination angle of a wafer etching groove will be too large, degrading the etching uniformity.

SUMMARY

The purpose of the embodiments of the present disclosure is to provide a wafer carrying apparatus and a semiconductor process device, which solve the problem that the distance between the edge protection ring and the wafer is relatively fixed during the process, resulting in over-etching of the edge of the wafer and excessive inclination angle of the etching groove of the wafer.

To solve the above technical problem, the present disclosure is implemented as follows.

One aspect of the present disclosure provides a wafer carrying apparatus being applied to a semiconductor process device. The wafer carrying apparatus includes: a base; an edge protection ring assembly; a first detection assembly; and a drive assembly. The base is used to carry a wafer and includes a cavity internally, the edge protection ring assembly includes an edge protection ring, a protection ring support, and a plurality of protection ring connection rods, the edge protection ring is arranged above the base, the protection ring support is arranged below the base at intervals, and the plurality of protection ring connection rods are connected between the protection ring support and the edge protection ring. The drive assembly is arranged in the cavity and connected to the protection ring support, the drive assembly is used to drive the protection ring support to drive the edge protection ring to move between a wafer transfer position and a process position in a vertical direction through the plurality of protection ring connection rods. The first detection assembly is used to detect a distance between the protection ring support and the base in the vertical direction, to control the drive assembly to drive the protection ring support to move according to the distance for adjusting the process position of the edge protection ring.

Another aspect of the present disclosure provides a semiconductor process device, comprising the disclosed wafer carrying apparatus.

In the embodiment of the present disclosure, the first detection assembly can detect the distance between the protection ring support and the base. When the base carries the wafer, the drive component drives the protection ring support to move according to the distance detected by the first detection assembly to adjust the process position of the edge protection ring, such that the distance between the edge protection ring and the wafer is adjustable to meet the actual process requirements. Therefore, the wafer carrying apparatus provided in the embodiments of the present disclosure can solve the problem of the relatively fixed distance between the edge protection ring and the wafer during the process, thereby avoiding the problem of over-etching of the edge of the wafer and the problem of excessive inclination angle of the etching groove of the wafer.

Figure 1:
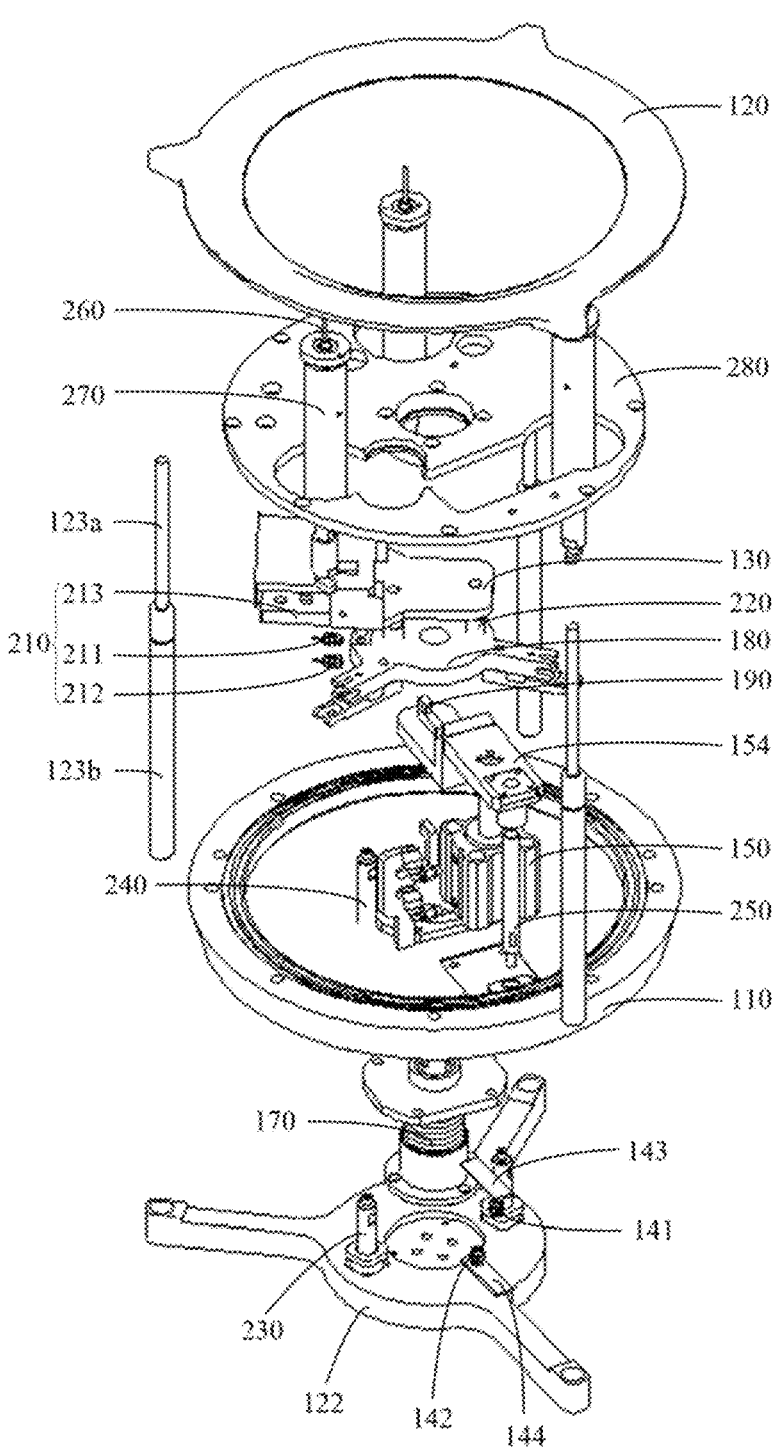
FIG. 1 is an exploded view of a wafer carrying apparatus according to some embodiments of the present disclosure.

The reference numerals in the drawings include: 110—base, 111—housing, 112—bottom plate, 120—edge protection ring assembly, 121—edge protection ring, 122—protection ring support, 123—protection ring connection rod, 123*a*—support needle, 123*b*—support needle sleeve, 130—limit baffle, 140—first detection assembly, 141—first photoelectric sensor, 142—second photoelectric sensor, 143—first signal processor, 144—second signal processor, 150—drive assembly, 151—cylinder, 152—first throttle valve, 153—second throttle valve, 154—transmission member, 155—first flow limiting gasket, 156—second flow limiting gasket, 157—adapter, 160—first positioning assembly, 161—first positioning member, 162—second positioning member, 170—telescopic sealing member, 180—thimble support, 190—second positioning assembly, 191—third positioning member, 210—second detection assembly, 211—first sensor, 212—second sensor, 213—optical fiber transmission member, 220—first guide member, 230—second guide member, 240—third guide member, 250—cylinder guide member, 260—thimble, 270—thimble sleeve, and 280—separation disk.

DETAILED DESCRIPTION OF THE EMBODIMENTS

The following will clearly and completely describe the technical solutions in the embodiments of the present disclosure with reference to the accompanying drawings. Obviously, the described embodiments are merely part of the embodiments of the present disclosure, not all of the embodiments. Based on the embodiments in the present disclosure, all other embodiments obtained by ordinary technicians in the field without creative work are within the scope of the present disclosure.

The terms "first", "second", etc. in the specification and claims of the present disclosure are used to distinguish similar objects, not to describe a specific order or sequence. It should be understood that the data used in this way can be interchanged where appropriate, such that the embodiments of the present disclosure can be implemented in an order other than those illustrated or described herein, and the objects distinguished by "first", "second", etc. are usually of one type, and the number of objects is not limited. For example, the first object can be one or more. In addition, "and/or" in the specification and claims refers to at least one of connected objects, and the character "/" generally refers to that the objects associated with each other are in an "or" relationship.

The following is a detailed description of a wafer carrying apparatus and a semiconductor process device in the embodiments of the present disclosure through specific embodiments and their application scenarios in combination with the drawings.

Figure 2:
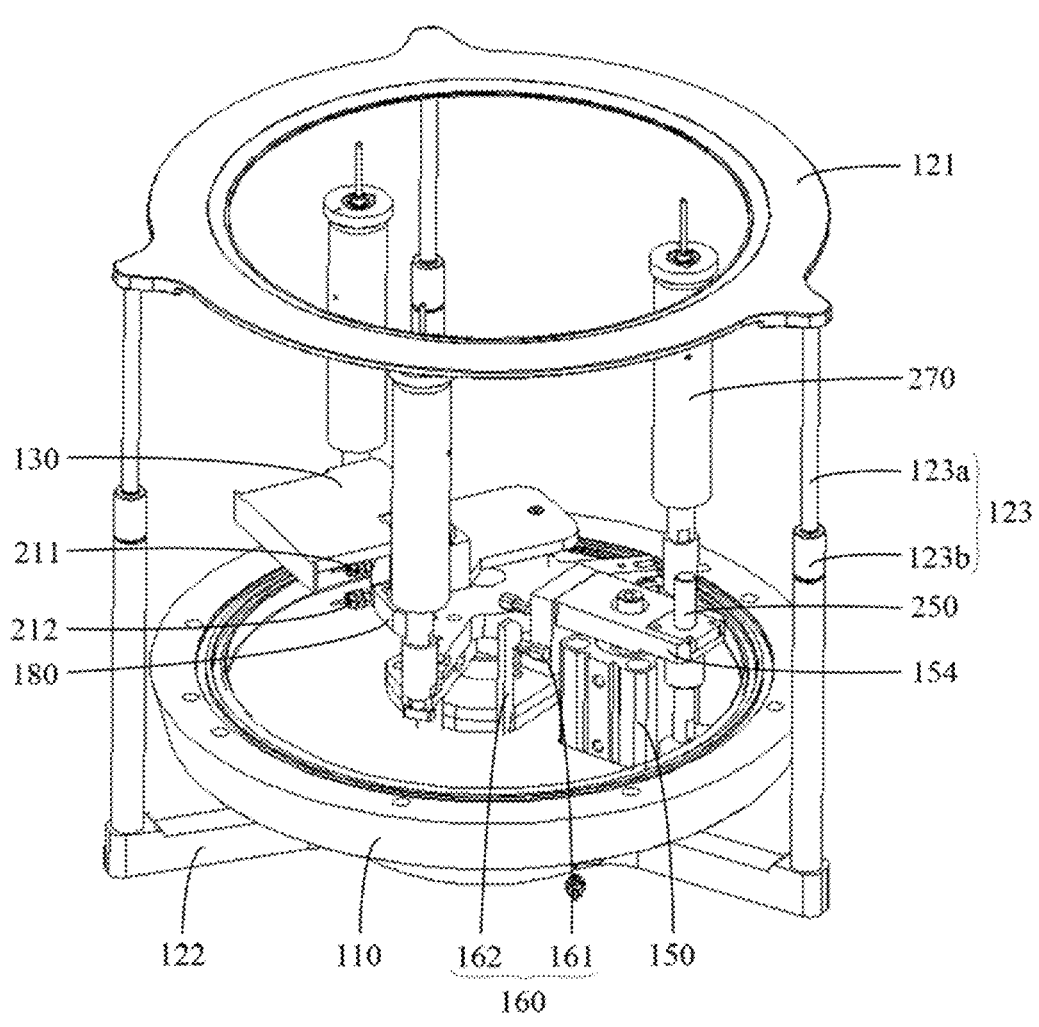
FIG. 2 is a schematic structural diagram of a wafer carrying apparatus according to some embodiments of the present disclosure.
Figure 3:
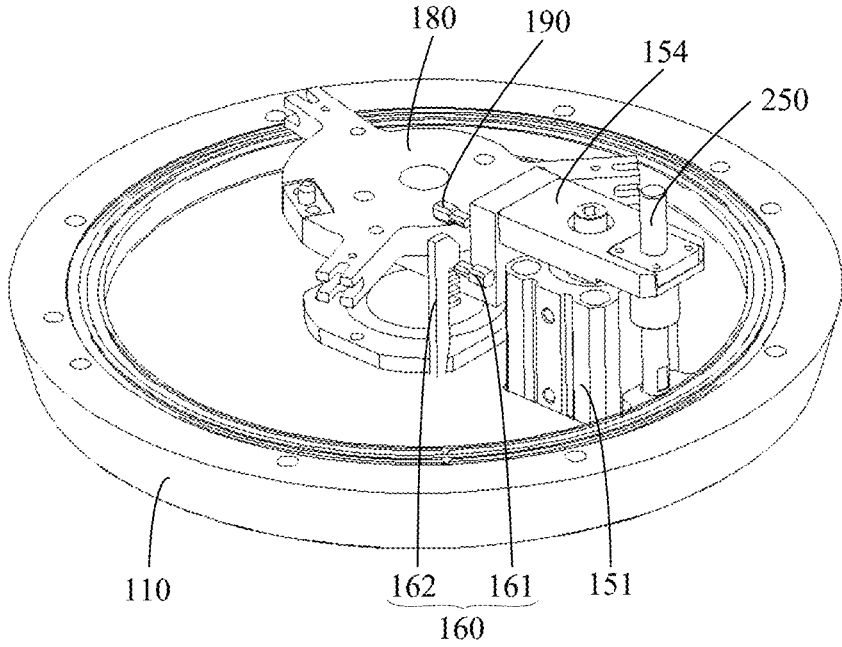
FIG. 3 is a partial structural diagram of the structure shown in FIG. 2.
Figure 4:
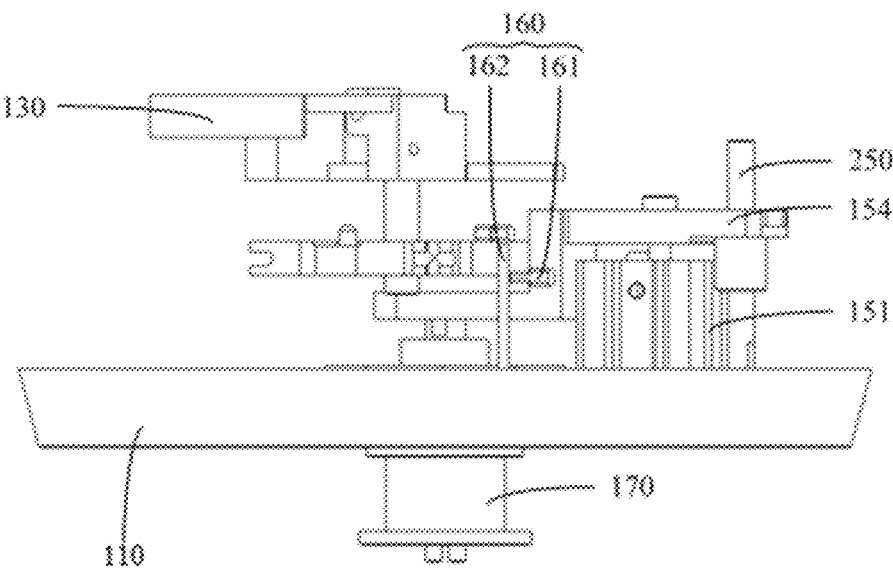
FIG. 4 is a side view of a partial structure of a wafer carrying apparatus according to some embodiments of the present disclosure.
Figure 5:
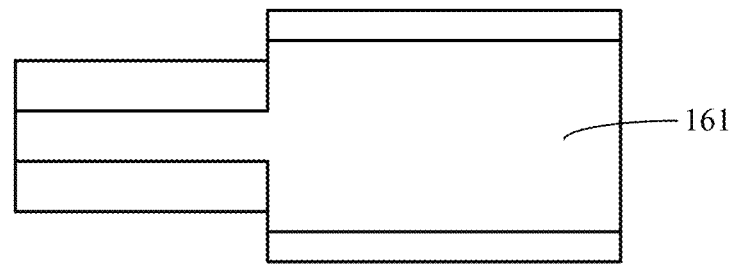
FIG. 5 is a schematic structural diagram of a first positioning member according to some embodiments of the present disclosure.
Figure 6:
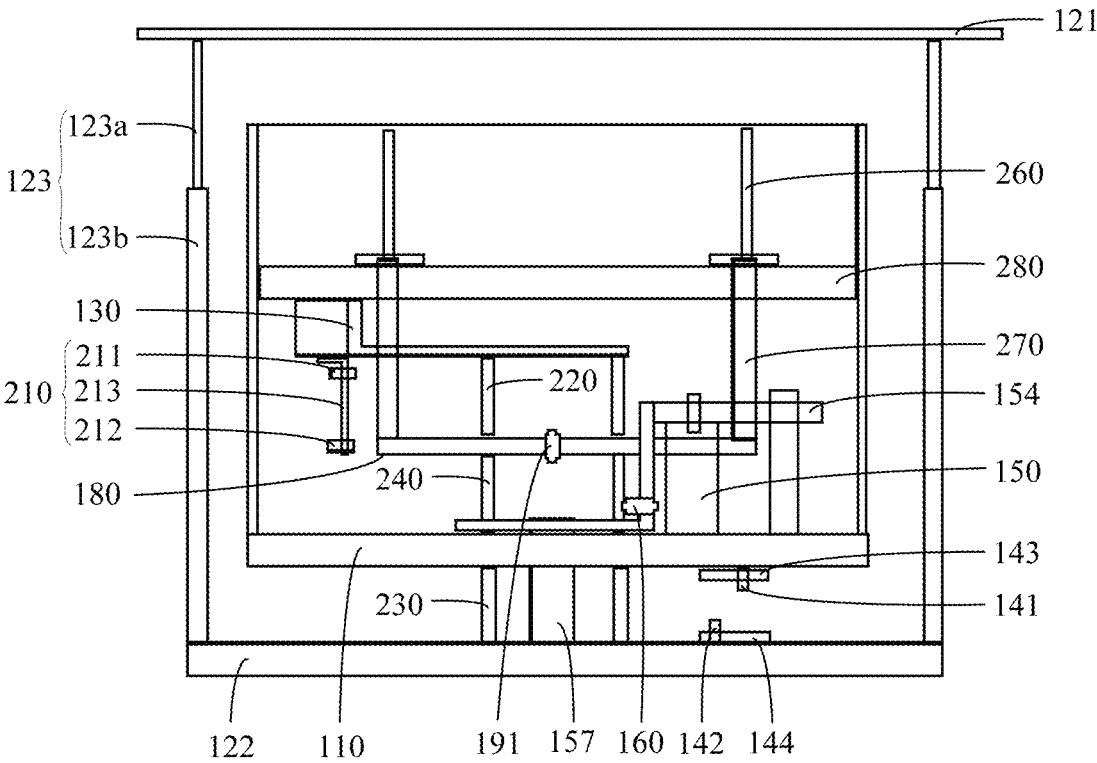
FIG. 6 is a cross-sectional view of a wafer carrying apparatus according to some embodiments of the present disclosure.
Figure 7:
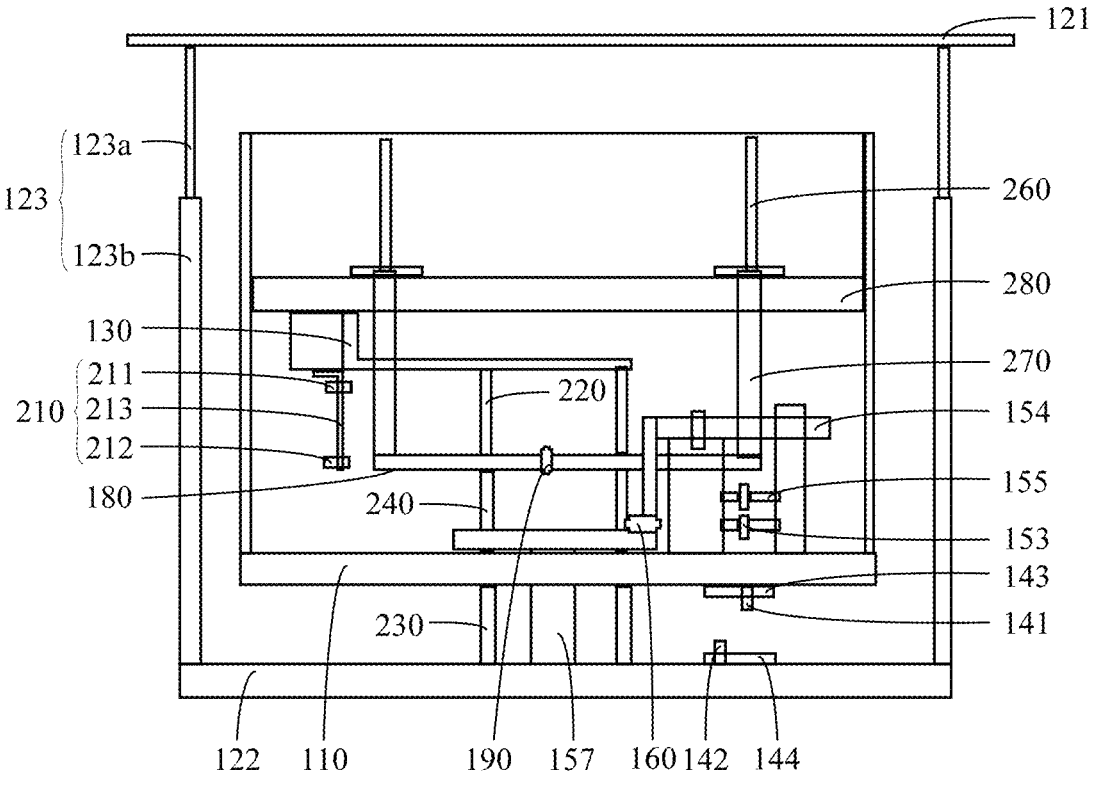
FIGS. 7-9 are cross-sectional views of a wafer carrying apparatus in various states according to some embodiments of the present disclosure.
Figure 8:
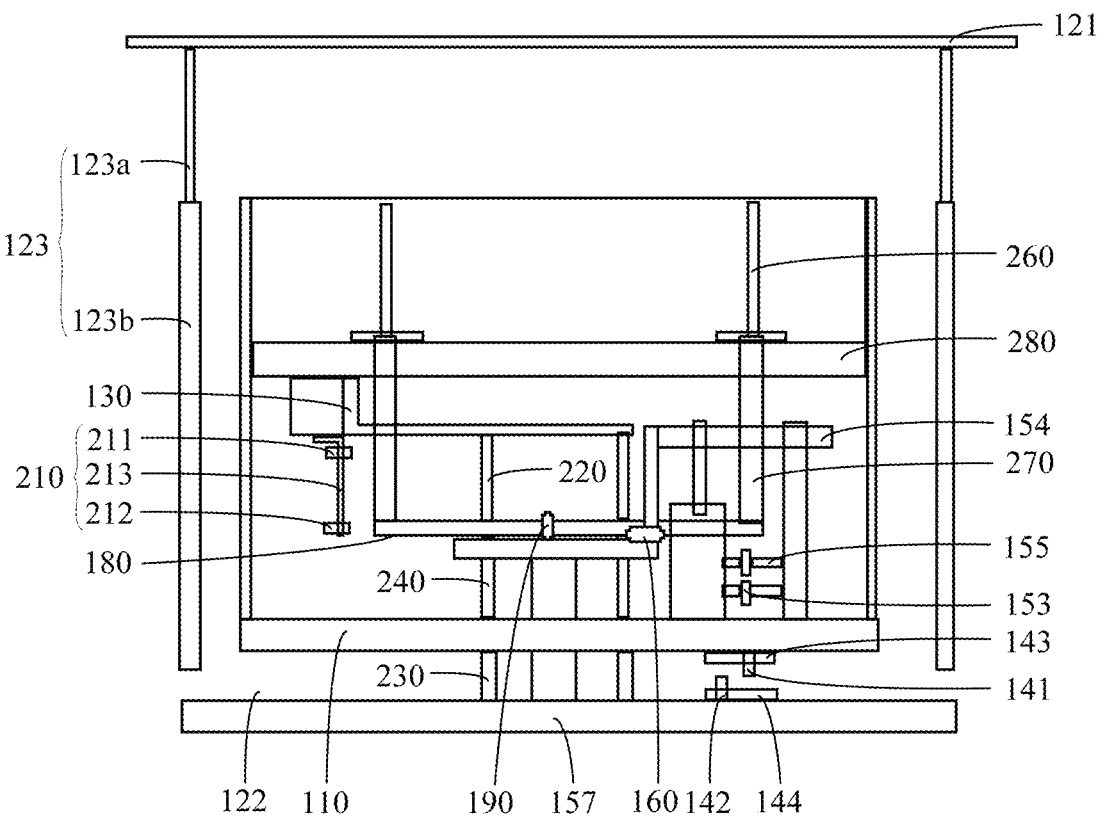
Figure 9:
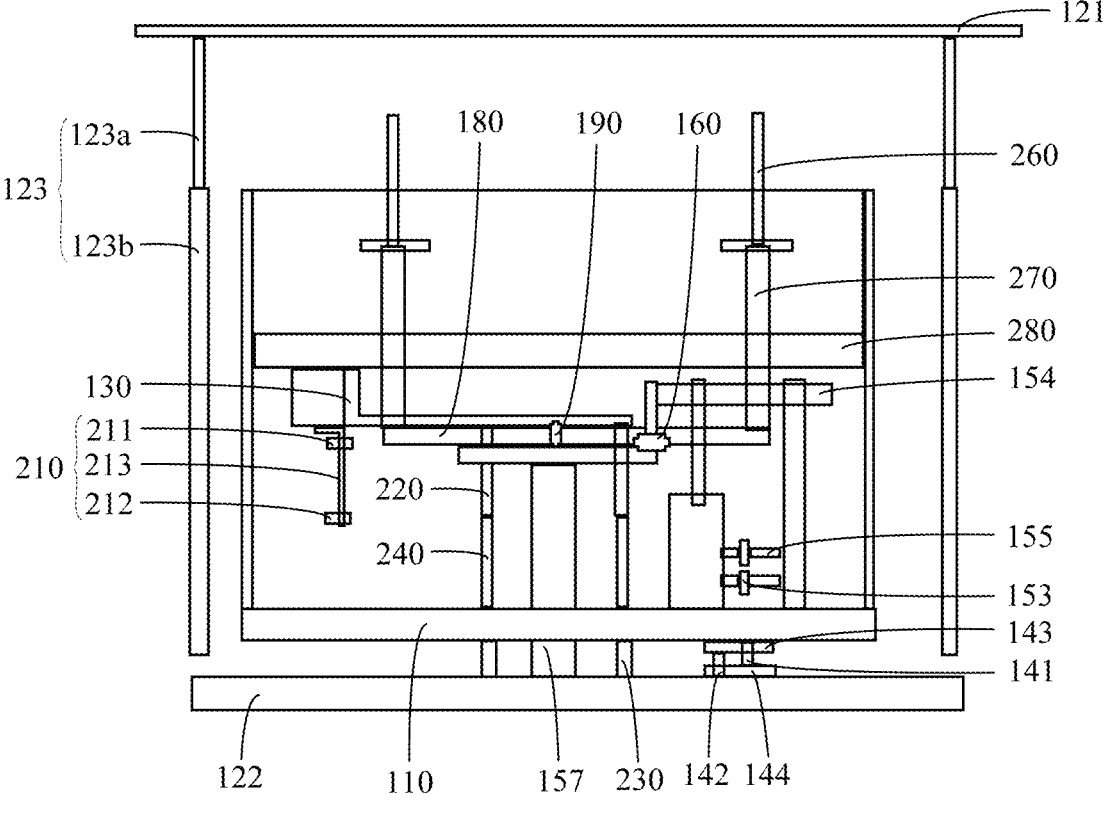
Figure 10:
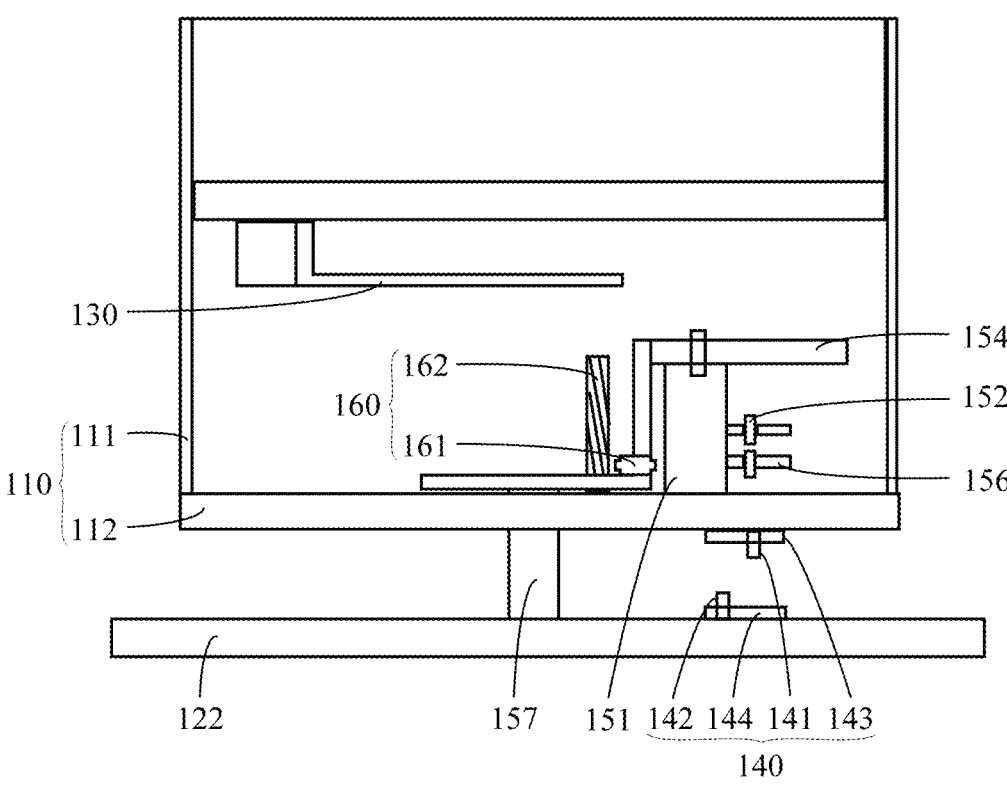
FIG. 10 is a cross-sectional view of a partial structure of a wafer carrying apparatus according to some embodiments of the present disclosure.
Figure 11:
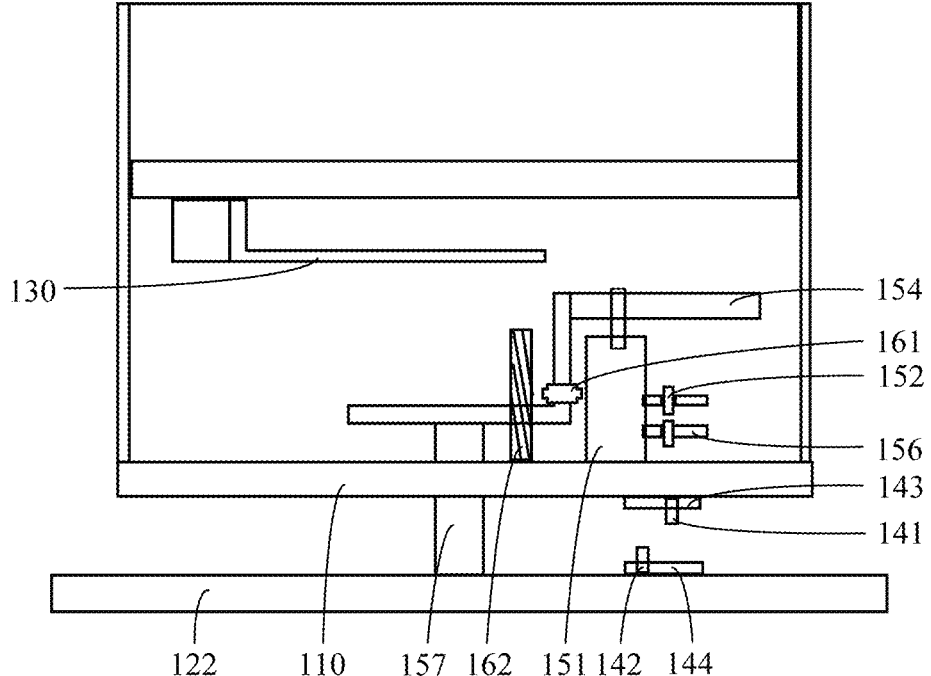
FIGS. 11-12 are schematic structural diagrams of the structure shown in FIG. 10 in a wafer transfer position according to some embodiments of the present disclosure.
Figure 12:
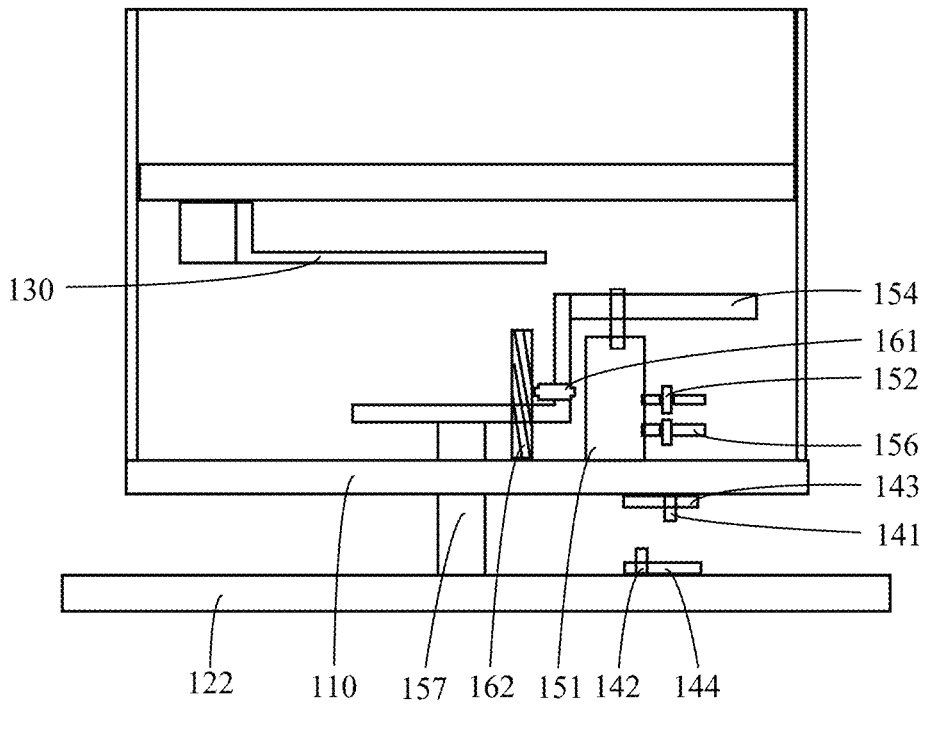
Figure 13:
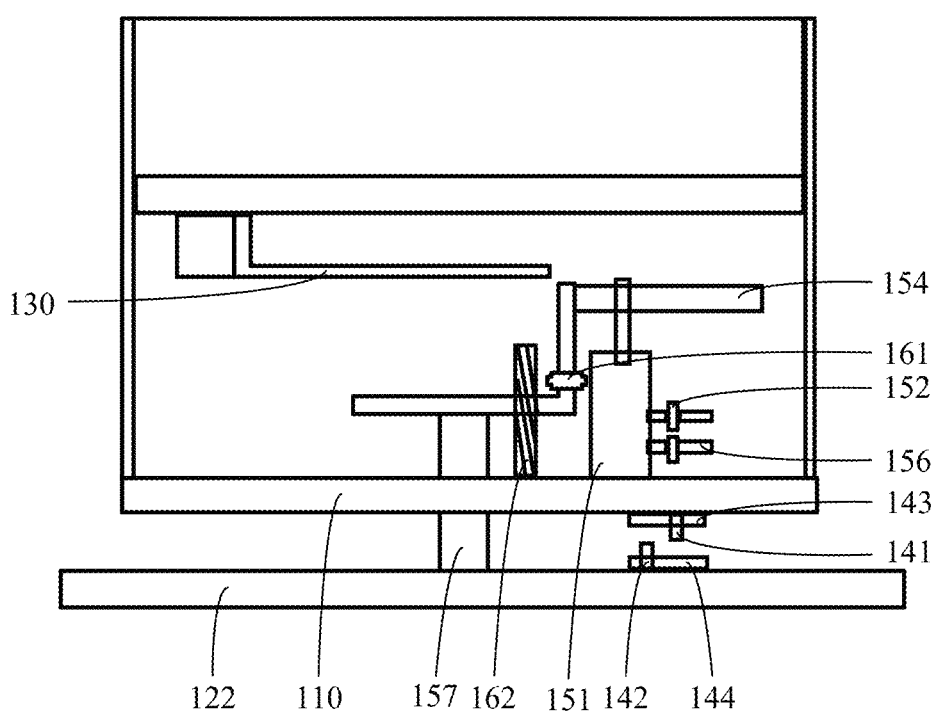
FIGS. 13-14 are schematic structural diagrams of the structure shown in FIG. 10 in a first position according to some embodiments of the present disclosure.
Figure 14:
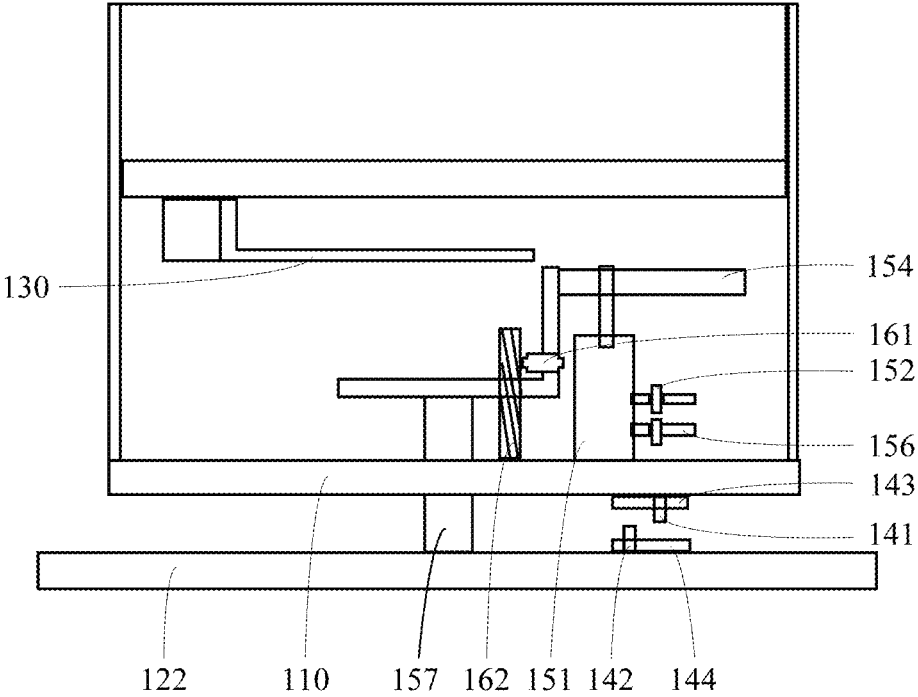
Figure 15:
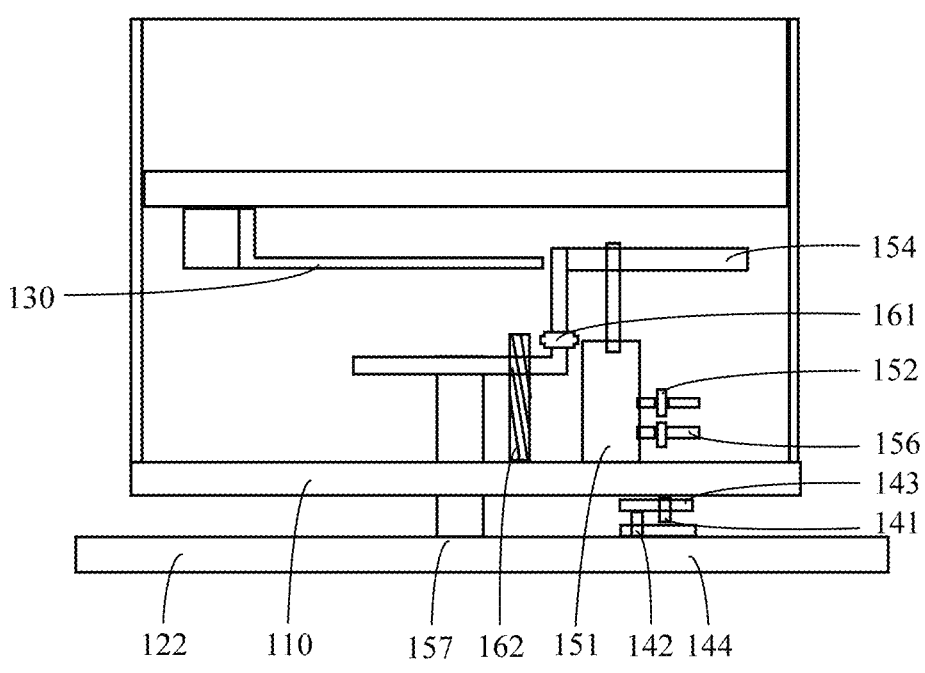
FIGS. 15-16 are schematic structural diagrams of the structure shown in FIG. 10 in a process position according to some embodiments of the present disclosure.
Figure 16:
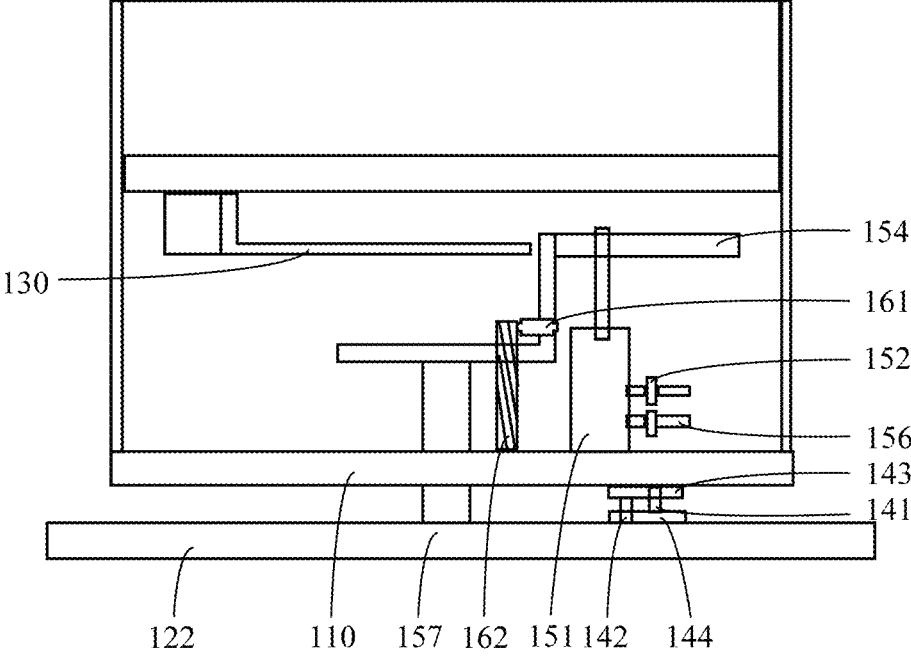

As shown in FIGS. 1 to 16, the present disclosure provides a wafer carrying apparatus. The wafer carrying apparatus may be applied to a semiconductor process device, and may include a base 110, an edge protection ring assembly 120, a first detection assembly 140, and a drive assembly 150.

The base 110 is a basic structure of the wafer carrying apparatus, and may provide an installation foundation for other structures of the wafer carrying apparatus. The base 110 may be used to carry a wafer and may include a cavity internally. In some embodiments, the base 110 includes a base plate 112 and a housing 111. The housing 111 is arranged on the base plate 112. The housing 111 and the base plate 112 together form the cavity.

The edge protection ring assembly 120 includes an edge protection ring 121, a protection ring support 122, and a plurality of protection ring connection rods 123. The edge protection ring 121 is used to protect an edge of the wafer during a semiconductor process. The protection ring support 122 may be arranged under the base 110 at intervals along a circumferential direction. The protection ring support 122 may be movably arranged on the base 110. The plurality of protection ring connection rods 123 may all be arranged on the protection ring support 122 and connected to the edge protection ring 121. In some embodiments, each protection ring connection rod 123 includes a support needle 123*a* and a support needle sleeve 123*b*. The support needle sleeve 123*b* is arranged on the protection ring support 122. The support needle 123*a* is connected between the support needle sleeve 123*b* and the edge protection ring 121. The support needle 123*a*, the support needle sleeve 123*b*, and the protection ring support 122 are all used as support structures of the edge protection ring 121. Further, in some embodiments, there may be at least three support needles 123*a*, and the support needle sleeve 123*b* is arranged one-to-one with the support needle 123*a*. Of course, the number of the support needles 123*a* may also be set according to actual needs, and no specific restrictions are imposed herein. In some embodiments, when the number of the support needles 123*a* is three, the protection ring support 122 may be a three-claw structure, thereby reducing the weight and cost of the protection ring support 122. Of course, the protection ring support 122 may also be other structures, and no specific restrictions are imposed herein.

The drive assembly 150 is disposed in the cavity and connected to the protection ring support 122. The drive assembly 150 is used to drive the protection ring support 122 to drive the edge protection ring 121 to move between a wafer transfer position and a process position in a vertical direction. When the edge protection ring 121 is located at the process position, there is a gap between the edge protection ring 121 and the edge of the wafer placed on the base 110 in a direction of a central axis of the edge protection ring 121. In some embodiments, the drive assembly 150 may be one of a hydraulic cylinder, a motor, a shape memory alloy, and a piezoelectric ceramic, which is not specifically limited herein.

The first detection assembly 140 is used to detect a distance between the protection ring support 122 and the base 110. When the base 110 carries the wafer, the drive assembly 150 drives the protection ring support 122 to move according to the distance between the protection ring support 122 and the base 110 to adjust the process position of the edge protection ring 121, such that the edge protection ring 121 moves between different process positions, that is, adjusting a distance between the edge protection ring 121 and the edge of the wafer such that the distance between the edge protection ring 121 and the edge of the wafer meets the actual process requirements. In the embodiments of the present disclosure, the first detection assembly 140 detects the distance between the protection ring support 122 and the base 110. When the base 110 carries the wafer, the drive assembly 150 drives the protection ring support 122 to move according to a distance detected by the first detection component 140 to adjust the process position of the edge protection ring 121, such that the distance between the edge protection ring 121 and the wafer is adjustable, thereby avoiding over-etching of the edge of the wafer and excessive inclination of an etching groove of the wafer. Therefore, the wafer carrying apparatus provided in the embodiments of the present disclosure can solve the problem that the distance between the edge protection ring 121 and the wafer is relatively fixed during the process, resulting in over-etching of the edge of the wafer and the excessive inclination angle of the etching groove of the wafer.

In some embodiments, the drive assembly 150 includes a cylinder 151, a transmission member 154, and an adapter 157. The cylinder 151 is arranged on the bottom plate 112 of the base 110. In some embodiments, the cylinder 151 may be a damping cylinder, which is small in size and stable in operation. A first end of the transmission member 154 is connected to an output shaft of the cylinder 151, a second end of the transmission member 154 is connected to one end of the adapter 157, and the other end of the adapter 157 passes through the bottom plate 112 and is connected to the protection ring support 122. The cylinder 151 drives the adapter 157 to rise and fall through the transmission member 154 to drive the protection ring support 122 to move.

In some embodiments, the wafer carrying apparatus also includes a first positioning assembly 160, which is arranged in the cavity and is used to position the transmission member 154, that is, to fix the adapter 157 connected to the transmission member 154 to fix the edge protection ring 121 at a current position, thereby improving the stability of the edge protection ring 121. The first positioning assembly 160 is used to fix the edge protection ring 121 at any position (i.e., the current position) when the edge protection ring 121 moves to any position. For example, when the edge protection ring 121 moves to the process position, the first positioning assembly 160 may fix the edge protection ring 121 at the process position. It should be noted that to reduce an occupied space, the drive assembly 150 is driven by the cylinder 151 with a volume smaller than an electric cylinder to adapt to a narrow space of the cavity. In this case, the first positioning assembly 160 is used in conjunction with the cylinder 151 to achieve stopping the cylinder, such that the edge protection ring 121 can be fixed at a specified position.

In some embodiments, the first positioning assembly 160 includes a first positioning member 161 and a second positioning member 162. The first positioning member 161 is connected to the drive assembly 150, and may be specifically set on the transmission member 154. The second positioning member 162 is connected to the base 110, for example, it is set on the bottom plate 112 of the base 110. When the drive assembly 150 drives the protection ring support 122 to move, the first positioning member 161 moves in the vertical direction relative to the second positioning member 162. At least one of the first positioning member 161 and the second positioning member 162 may move in a first direction that is angled with the vertical direction, such that the first positioning member 161 and the second positioning member 162 can switch between positioning and matching with each other and releasing the positioning with each other. The first direction forms an angle with the vertical direction. The first direction specifically refers to a direction perpendicular to the vertical direction, that is, a horizontal direction. Of course, there may also be an angle between the first direction and the vertical direction, which is not specifically limited herein. For example, when the edge protection ring 121 is located at the process position, the edge protection ring 121 may be fixed at the process position by positioning and matching the first positioning member 161 with the second positioning member 162. At least one of the first positioning member 161 and the second positioning member 162 moves, for example, along the first direction. When the cylinder 151 drives the edge protection ring 121 to adjust to the process position, the output shaft of the cylinder 151 stops operating, and at least one of the first positioning member 161 and the second positioning member 162 moves along the first direction to a position where they are positioned and matched with each other, thereby fixing the edge protection ring 121 to improve the stability of the edge protection ring 121 and avoid changes in the position of the edge protection ring 121 during the process. Specifically, the first positioning member 161 may be fixed while the second positioning member 162 moves along the first direction to a position where it is positioned and matched with the first positioning member 161. Alternatively, the second positioning member 162 may be fixed while the first positioning member 161 moves along the first direction to a position where it is positioned and matched with the second positioning member 162. Alternatively, the first positioning member 161 and the second positioning member 162 may move relative to each other along the first direction to positions where they are positioned and matched with each other. In addition, compared to a method in which the first positioning assembly 160 is provided on one of the base plate 112 and the transmission member 154, and then positioned and matched with the other, the first positioning member 161 and the second positioning member 162 are provided on different members, and the positions of the two may be selected more flexibly, thereby facilitating the structural design of the wafer carrying apparatus.

In some embodiments, the second positioning member 162 is extended in the vertical direction such that when the first positioning member 161 moves, the second positioning member 162 always overlaps with the first positioning member 161 in the first direction. When the two overlap, it is ensured that the first positioning member 161 can be positioned and matched with an overlapping part of the second positioning member 162 when the first positioning member 161 moves in the first direction. At least one of the first positioning member 161 or the second positioning member 162 is an electromagnetic member, that is, the first positioning member 161 may be an electromagnetic member, the second positioning member 162 may be an electromagnetic member, or both the first positioning member 161 and the second positioning member 162 may be electromagnetic members. No specific limitation is imposed herein. When the electromagnetic member is powered on, the first positioning member 161 and the second positioning member 162 are positioned and matched. When the electromagnetic member is powered off, the first positioning member 161 and the second positioning member 162 are released to facilitate control. Further, in some embodiments, the second positioning member 162 is an electromagnetic member, and the first positioning member 161 is a magnetic member. When the magnetic member is close to the electromagnetic member, the electromagnetic member is energized to make the magnetic member and the electromagnetic member magnetically connected. Because the electromagnetic member is fixed, it is easy to control.

In some embodiments, the second positioning member 162 may be a strip-shaped member, and extends along a moving direction of the protection ring support 122. Because the first positioning member 161 is arranged on the transmission member 154, when the second positioning member 162 of the strip-shaped structure extends along the moving direction of the protection ring support 122, it is beneficial to increase a contact range of the first positioning member 161 and the second positioning member 162 to facilitate the positioning and matching of the first positioning member 161 and the second positioning member 162.

Further, in some embodiments, the second positioning member 162 is provided with a plurality of first positioning grooves in the vertical direction, and the first positioning member 161 includes a first body and a first magnetic head. The first body may be fixedly arranged on the transmission member 154 by fasteners such as screws. The first magnetic head may be movably arranged on the first body. When the first magnetic head is powered on, the first magnetic head is positioned and matched with one of the plurality of first positioning grooves. At this point, there is both magnetic positioning and mechanical positioning, thereby further improving the positioning stability of the first positioning member 161 and the second positioning member 162.

In some embodiments, the wafer carrying apparatus further includes a thimble support 180 and a limit baffle 130. The limit baffle 130 is fixedly arranged in the cavity. In some embodiments, the limit baffle 130 is arranged on the housing 111, and a bottom surface of the limit baffle 130 is provided with a plurality of first guide members 220 extending in the vertical direction. The thimble support 180 is slidably connected with the plurality of first guide members 220. The plurality of first guide members 220 provide a guiding function for the movement of the thimble support 180. When the edge protection ring 121 rises to the first position, the transmission member 154 contacts the thimble support 180. When the transmission member 154 drives the edge protection ring 121 to continue to rise from the first position to the wafer transfer position, the transmission member 154 also drives the thimble support 180 to rise synchronously until the thimble support 180 stops at the limit baffle 130. At this point, the limit baffle 130 prevents the thimble support 180 from continuing to rise. When the thimble support 180 descends from the wafer transfer position, the thimble support 180 and the edge protection ring 121 synchronously descend to the first position, the thimble support 180 separates from the transmission member 154, and the transmission member 154 drives the edge protection ring 121 to continue to descend. When the edge protection ring 121 descends from the first position to the process position, the first detection assembly 140 is turned on to detect a distance between the protection ring support 122 and the base 110, and the process position of the edge protection ring 121 is adjusted according to the distance. It can be seen that the present disclosure uses a same driving mechanism to drive the edge protection ring 121 and the thimble support 180 through the mechanical linkage. Compared with using different mechanisms to move the edge protection ring 121 and the thimble support 180 respectively, the present disclosure improves the convenience of operating the wafer carrying apparatus.

In some embodiments, the thimble support 180 may be hung on the plurality of first guide members 220, such that the thimble support 180 and the plurality of first guide members 220 are always connected to achieve the installation of the thimble support 180. In some embodiments, the wafer carrying apparatus also includes a thimble 260 and a thimble sleeve 270. The thimble sleeve 270 is arranged on the thimble support 180, and the thimble 260 is arranged on the thimble sleeve 270. When the thimble support 180 moves, the thimble sleeve 270 and the thimble 260 move together.

Further, in some embodiments, there are at least three thimbles 260, which are arranged at intervals in the circumferential direction. The thimble sleeve 270 is arranged in a one-to-one correspondence with the thimble 260 to spread any force acting on the wafer to improve the stability of the wafer transfer.

In some embodiments, when there are three thimbles 260, the thimble support 180 may be a three-claw structure, thereby reducing the size and weight of the thimble support 180, and saving space for other structures.

In some other embodiments, the wafer carrying apparatus further includes a second detection assembly 210. The second detection assembly 210 includes a first sensor 211 and a second sensor 212. The first sensor 211 and the second sensor 212 are arranged at intervals along the moving direction of the thimble support 180. When the thimble support 180 contacts the limit baffle 130, the first sensor 211 is triggered, and the cylinder 151 may be closed at this point. Thus, the cylinder 151 no longer applies a force to the transmission member 154, thereby preventing the thimble support 180 from further rising and excessively pressing the limit baffle 130 or damaging the cylinder 151. When the thimble support 180 is in the first position, the second sensor 212 is triggered, which indicates that the thimble support 180 has moved to a lower limit position.

In some embodiments, the first sensor 211 and the second sensor 212 may both be optical fiber sensors, which can emit light and accurately determine the position of the thimble support 180 through detecting an intensity of light irradiated on the thimble support 180.

In some embodiments, the second detection assembly 210 also includes an optical fiber transmission member 213. The first sensor 211 and the second sensor 212 are both arranged on the optical fiber transmission member 213. The optical fiber transmission member 213 is used to electrically connect the first sensor 211 and the second sensor 212 for easy control. Of course, the first sensor 211 and the second sensor 212 may also be controlled separately. The present disclosure imposes no specific limitation herein.

In some embodiments, the wafer carrying apparatus further includes a separation disk 280, which is disposed on the housing 111 of the base 110. The limit baffle 130 is disposed on the separation disk 280. The limit baffle 130 is located on a side of the separation disk 280 facing toward the thimble support 180. The optical fiber transmission member 213 is disposed on the limit baffle 130, thereby increasing a detection range of the first sensor 211 and the second sensor 212 relative to the thimble support 180.

In some embodiments, the wafer carrying apparatus further includes a second positioning assembly 190. The second positioning assembly 190 includes a third positioning member 191 and a fourth positioning member. The third positioning member 191 is disposed on the thimble support 180, and the fourth positioning member is disposed on the transmission member 154. When the thimble support 180 contacts the limit baffle 130, the third positioning member 191 is positioned and matched with the fourth positioning member, such that the transmission member 154 can drive the thimble support 180 and the protection ring support 122 to synchronously descend to the first position. When the third positioning member 191 and the fourth positioning member are positioned and matched, the thimble support

180 moves with the transmission member 154, thereby preventing the transmission member 154 from being separated from the thimble support 180 to improve connection stability between the transmission member 154 and the thimble support 180. When the third positioning member 191 and the fourth positioning member are released from the matching, the thimble support 180 is separated from the transmission member 154, at which time only the transmission member 154 moves, and the thimble 260 connected to the thimble support 180 is maintained at its own process position. It can be seen that the third positioning member 191 and the fourth positioning member are provided in the present disclosure to improve the connection stability between the thimble support 180 and the transmission member 154. At the same time, the thimble support 180 can be quickly driven by the transmission member 154, such that the thimble support 180 quickly drives the thimble 260 to its process position.

In the embodiments of the present disclosure, the wafer carrying apparatus includes both the second positioning assembly 190 and the second detection assembly 210. When the thimble support 180 contacts the limit baffle 130, the first sensor 211 is triggered, and the third positioning member 191 may be controlled to be positioned and matched with the fourth positioning component, such that the transmission component 154 can drive the thimble support 180 and the protection ring support 122 to synchronously descend to the first position. When the thimble support 180 is in the first position, the second sensor 212 is triggered, and the third positioning member 191 and the fourth positioning member may be controlled to be released, and the thimble support 180 is separated from the transmission component 154, and only the transmission component 154 continues to descend.

In some embodiments, the third positioning member 191 and the fourth positioning member both may be magnetic members. At least one of the third positioning member 191 or the fourth positioning member is an electromagnetic member. When the electromagnetic member is energized, the third positioning member 191 and the fourth positioning member are magnetically matched for easy control.

In some embodiments, the third positioning member 191 is disposed on a bottom surface of the thimble support 180. In some other embodiments, the third positioning member 191 is disposed on a side wall of the thimble support 180. The third positioning member 191 may include a second body and a second magnetic head. The second body is disposed on the thimble support 180. The second magnetic head is movably disposed on the second body. The fourth positioning member is provided with a second positioning groove. When the second magnetic head is powered on, the second magnetic head may be positioned and matched with the second positioning groove. At this point, both magnetic positioning and mechanical positioning are effective, thereby improving the positioning stability of the third positioning member 191 and the fourth positioning member. In some embodiments, the transmission member 154 may be either a magnetic member or a non-magnetic member. When the transmission member 154 is a non-magnetic member, the fourth positioning member may be separately arranged on the transmission member 154. At this point, the structure and setting position of the fourth positioning member may be flexibly selected to facilitate the positioning and matching of the third positioning member 191 and the fourth positioning member. When the transmission member 154 is a magnetic member, the fourth positioning member may be integrally arranged with the transmission member 154. At this point, the structure of the wafer carrying apparatus is simpler and the cost thereof is lower. In some other embodiments, the wafer carrying apparatus also includes a telescopic sealing member 170 and at least one second guide member 230. The telescopic sealing member 170 is sleeved on the outer side of the adapter 157. One end of the telescopic sealing member 170 is sealed and connected to the bottom plate 112. An inner cavity of the telescopic sealing member 170 is connected to the cavity of the base 110. The other end of the telescopic sealing member 170 is connected to the adapter 157, thereby separating the cavity of the base 110 from the external environment to satisfy process conditions. The at least one second guide member 230 is disposed between the bottom plate 112 and the protection ring support 122. The protection ring support 122 moves along the second guide member 230 in the vertical direction relative to the bottom plate 112, thereby preventing the protection ring support 122 from tilting. Thus, the movement accuracy of the protection ring support 122 is improved. Further, in some embodiments, there may be at least two second guide members 230, and each second guide member 230 is disposed at intervals to spread out the force, thereby improving the guiding accuracy. Of course, the number of the second guide members 230 may be set according to actual needs, and no specific limitation is imposed herein.

In some embodiments, the wafer carrying apparatus further includes a cylinder guide member 250 and at least one third guide member 240. Both are arranged on the bottom plate 112 and are respectively located on both sides of the cylinder 151. The cylinder 151 drives the transmission member 154 to move along the cylinder guide member 250 and the third guide member 240. The cylinder guide member 250 and the third guide member 240 provide a guiding function for the output shaft of the cylinder 151 and the movement of the transmission member 154, thereby improving the movement stability of the transmission member 154. In some embodiments, the transmission member 154 may be a Z-shaped structure. The transmission member 154 includes a first plate segment, a second plate segment, and a third plate segment connected in sequence. The first plate segment is parallel to the third plate segment. The second plate segment is bent relative to the first plate segment and the third plate segment respectively. When the edge protection ring 121 is in the first position, the first plate segment contacts the thimble support 180, and the third plate segment is connected to the output shaft of the cylinder 151.

When the thimble support 180 is mounted on the first guide member 220, the first guide member 220 and the second guide member 230 may be separately arranged. In some embodiments, the first guide member 220 and the second guide member 230 may be coaxially arranged, and the two may be an integral structure. In this case, the transmission member 154 and the thimble support 180 may be simultaneously sleeved on the same guide member to facilitate the arrangement of the first guide member 220 and the second guide member 230. In some embodiments, when the first guide member 220 and the second guide member 230 are coaxially arranged, and the two are an integral structure. The guide members may be arranged on the bottom surface of the separation disk 280, which eliminates the need for the limit baffle 130, thereby simplifying the structure and saving costs.

In some embodiments, the drive assembly 150 further includes a first throttle valve 152 and a second throttle valve 153. The first throttle valve 152 is arranged in the first gas channel of the cylinder 151. In some embodiments, the first throttle valve 152 may be arranged at a first through-hole of the cylinder 151, or may be arranged on the first gas channel of the cylinder 151, which is not limited herein. The second throttle valve 153 is arranged in a second gas channel of the cylinder 151. In some embodiments, the second throttle valve 153 may be arranged at a second through-hole of the cylinder 151, or may be arranged on the second gas channel of the cylinder 151, which is not specifically limited herein. The first end of the transmission member 154 is connected to the output shaft of the cylinder 151, and the second end of the transmission member 154 is connected to the protection ring support 122. The cylinder 151 drives the protection ring support 122 to move through the transmission member 154. In the process, an air intake of the cylinder 151 is adjusted by the first throttle valve 152 or the second throttle valve 153 to improve lifting and lowering stability of the edge protection ring 121. During a lifting process of the output shaft of the cylinder 151, gas enters the cylinder 151 from the first gas channel and then is discharged from the second gas channel. At the same time, the opening of the first throttle valve 152 gradually increases, thereby adjusting the intake volume in the cylinder 151. During a lowering process of the output shaft of the cylinder 151, gas enters the cylinder 151 from the second gas channel and then is discharged from the first gas channel. At the same time, the opening of the second throttle valve 153 gradually increases, thereby adjusting the intake volume in the cylinder 151. It can be seen that the first gas channel and the second gas channel in the present disclosure can be used as both an intake channel and an exhaust channel. By respectively setting the first throttle valve 152 and the second throttle valve 153 in the first gas channel and the second gas channel, the intake volume entering the cylinder 151 is adjusted to adjust the moving stability of the output shaft of the cylinder 151, thereby improving the control accuracy of adjusting the process position of the edge protection ring 121.

In some embodiments, the drive assembly 150 further includes a first flow limiting gasket 155 and a second flow limiting gasket 156. The first flow limiting gasket 155 is disposed in the first gas channel. When the output shaft of the cylinder 151 rises, the first flow limiting gasket 155 is used to adjust an amount of gas entering the cylinder 151 to ensure smoothness of the gas supply in the cylinder 151, thereby improving the lifting stability of the transmission member 154. The second flow limiting gasket 156 is disposed in the second gas channel. When the output shaft lowers, the first flow limiting gasket 155 is used to adjust the amount of gas entering the cylinder 151 to ensure smoothness of the gas supply in the cylinder 151, thereby improving the lowering stability of the transmission member 154.

In the embodiments of the present disclosure, the drive assembly 150 further includes the first throttle valve 152 and the second throttle valve 153. The drive assembly 150 further includes the first flow limiting gasket 155 and the second flow limiting gasket 156. When the first gas channel is the intake channel, the first throttle valve 152 and the first flow limiting gasket 155 work together to adjust an intake flow rate of the first gas channel, thereby further improving the movement stability of the edge protection ring 121. Similarly, when the second gas channel is the intake channel, the second throttle valve 153 and the second flow limiting gasket 156 work together to adjust an intake flow rate of the second gas channel, thereby further improving the movement stability of the edge protection ring 121. At the same time, through the first throttle valve 152, the second throttle valve 153, the first flow limiting gasket 155, and the second flow limiting gasket 156, the gas flow of the cylinder 151 may be reduced when the transmission member 154 is positioned and matched with the base 110, thereby reducing the force applied by the cylinder 151 to the transmission member 154. Thus, the force may drive the transmission member 154 to move. As such, the cylinder 151 does not need to be closed. When the cylinder 151 needs to drive the transmission member 154 to move again, the gas flow may be directly adjusted without taking a long time to restart the cylinder 151.

In some embodiments, the first flow limiting gasket 155 may be located downstream of the first throttle valve 152, or upstream of the first throttle valve 152, and no specific limitations are imposed herein. In some embodiments, the second flow limiting gasket 156 may be located downstream of the second throttle valve 153, or upstream of the second throttle valve 153, and no specific limitations are imposed herein.

In some embodiments, the drive assembly 150 further includes a damping spring. One end of the damping spring is connected to the output shaft of the cylinder 151, and the other end is connected to the transmission member 154. During the lifting or lowering of the output shaft of the cylinder 151, the damping spring may absorb vibration of the output shaft, thereby adjusting the movement stability of the output shaft, and further improving the control accuracy of the edge protection ring 121. In the embodiments of the present disclosure, the drive assembly 150 includes the first throttle valve 152, the second throttle valve 153, the first flow limiting gasket 155, and the second flow limiting gasket 156. The drive assembly 150 also includes the damping spring. At this point, during the lifting or lowering of the output shaft, the damping spring, the throttle valves, and the flow limiting gaskets jointly adjust the movement stability of the output shaft to further improve the control accuracy of the edge protection ring 121.

In some embodiments, the first detection assembly 140 includes a first photoelectric sensor 141, a first signal processor 143, a second photoelectric sensor 142, and a second signal processor 144. On two surfaces opposite the bottom plate 112 of the protection ring support 122, one is provided with the first signal processor 143 and the other is provided with the second signal processor 144. The first photoelectric sensor 141 is provided on the first signal processor 143 and the two are electrically connected. The second photoelectric sensor 142 is provided on the second signal processor 144 and the two are electrically connected. The first photoelectric sensor 141 and the second photoelectric sensor 142 are staggered. The first signal processor 143 is used to reflect the light emitted by the second photoelectric sensor 142, and the second signal processor 144 is used to reflect the light emitted by the first photoelectric sensor 141. When the drive assembly 150 drives the protection ring support 122 to move relative to the base 110, a distance between the protection ring support 122 and the base 110 changes, and the intensity of a light emitted from the first photoelectric sensor 141 to the second signal processor 144 changes. The second signal processor 144 reflects the light to the first photoelectric sensor 141, and the first signal processor 143 electrically connected to the first photoelectric sensor 141 calculates the distance between the protection ring support 122 and the base 110 through the change in the intensity of the reflected light. In some other embodiments, because the distance between the protection ring support 122 and the base 110 changes, the second signal processor 144 may also calculate the distance between the protection ring support 122 and the base 110 by calculating a time difference between an incident light and a reflected light, which is not specifically limited herein.

Similarly, the intensity of a light emitted by the second photoelectric sensor 142 to the first signal processor 143 changes, and the first signal processor 143 reflects the light to the second photoelectric sensor 142. The second signal processor 144 electrically connected to the second photoelectric sensor 142 calculates the distance between the protection ring support 122 and the base 110 through the change in the intensity of the reflected light, thereby improving detection accuracy of the first detection assembly 140. In some other embodiments, because the distance between the protection ring support 122 and the base 110 changes, the first signal processor 143 may also calculate the distance between the protection ring support 122 and the base 110 by calculating the time difference between the incident light and the reflected light, which is not specifically limited herein. By configuring two sets of sensors and processors, the adjustment accuracy may be improved when adjusting the position of the edge protection ring 121.

In some embodiments, the first signal processor 143 and the second signal processor 144 are both made of a material with reflective properties. In some embodiments, the first photoelectric sensor 141 and the second photoelectric sensor 142 may also be other detection components, which are not specifically limited herein. In some embodiments, the first photoelectric sensor 141 and the second photoelectric sensor 142 may be photoelectric sensors of the same type, or different types of photoelectric sensors, which are not specifically limited herein.

The operation process of the wafer carrying apparatus disclosed in the embodiments of the present disclosure is described as follows. In the process of the edge protection ring 121 lifting from the process position to the wafer transfer position, the cylinder 151 drives the transmission member 154 to lift along the third guide member 240 until the edge protection ring 121 is located at the first position. At this time, the transmission member 154 contacts the thimble support 180, and then the transmission member 154 pushes the thimble support 180 to lift synchronously along the first guide member 220. When the edge protection ring 121 lifts to the wafer transfer position, the thimble support 180 stops at the limit baffle 130. At this point, the first sensor 211 is triggered, and then the cylinder 151 is closed, and the third positioning member 191 is positioned and matched with the fourth positioning member, such that the thimble support 180 is fastened to the transmission member 154. After the wafer transfer is completed, the cylinder 151 is started again, such that the edge protection ring 121 can be lowered from the wafer transfer position to the process position. In the process of the edge protection ring 121 being lowered from the wafer transfer position to the process position, the cylinder 151 drives the transmission member 154 to drive the thimble support 180 to synchronously lower along the first guide member 220 until the second sensor 212 is triggered. At this point, the edge protection ring 121 is in the first position, the third positioning member 191 and the fourth positioning member are released, and the thimble support 180 no longer lowers. The transmission member 154 drives the edge protection ring 121 to continue to lower to the process position. In the process of the edge protection ring 121 lowering from the first position to the process position, the first detection assembly 140 is turned on and used to detect the distance between the protection ring support 122 and the base 110. The drive assembly 150 adjusts the process position of the edge protection ring 121 according to the distance, such that the edge protection ring 121 can reach different process positions as the process progresses.

The embodiments of the present disclosure are described above in conjunction with the accompanying drawings, but the present disclosure is not limited to the above-described specific implementation methods. The above-described specific implementation methods are merely illustrative and not restrictive. Under the principle of the present disclosure, ordinary people skilled in the art can also make various improvements and modifications without departing from the objectives of the present disclosure and the scope of the claims, all of which belong to the scope of the present disclosure.

What is claimed is:

1. A wafer carrying apparatus being applied to a semiconductor process device, comprising:
   a base;
   an edge protection ring assembly;
   a first detection assembly; and
   a drive assembly;
   wherein:
      the base is used to carry a wafer and includes a cavity internally, the edge protection ring assembly includes an edge protection ring, a protection ring support, and a plurality of protection ring connection rods, the protection ring support is arranged below the base at intervals, and the plurality of protection ring connection rods are connected between the protection ring support and the edge protection ring;
      the drive assembly is arranged in the cavity and connected to the protection ring support, the drive assembly is used to drive the protection ring support to drive the edge protection ring to move between a wafer transfer position and a process position in a vertical direction through the plurality of protection ring connection rods; and
      the first detection assembly is used to detect a distance between the protection ring support and the base in the vertical direction, to control the drive assembly to drive the protection ring support to move according to the distance for adjusting the process position of the edge protection ring when the base carries the wafer.

2. The wafer carrying apparatus according to claim 1, wherein the drive assembly includes a cylinder, a transmission member, and an adapter, the cylinder is arranged on a bottom plate of the base, a first end of the transmission member is connected to an output shaft of the cylinder, a second end of the transmission member is connected to one end of the adapter, the other end of the adapter passes through the bottom plate and is connected to the protection ring support, and the cylinder drives the adapter to lift and lower through the transmission member to drive the protection ring support to move;
   further comprising a first positioning assembly arranged in the cavity and used to position the drive assembly to fix the edge protection ring at a current position when the edge protection ring at the current process position.

3. The wafer carrying apparatus according to claim 2, wherein:
   the first positioning assembly includes a first positioning member and a second positioning member, the first positioning member is arranged at the transmission member, the second positioning member is arranged at the bottom plate, one of the first positioning member and the second positioning member moves along a first direction, when he edge protection ring is arranged at the process position, the first positioning member and the second positioning member are positioning and matching, and the first direction has an angle with a vertical direction.

4. The wafer carrying apparatus according to claim 3, wherein:
   at least one of the first positioning member or the second positioning member is an electromagnetic member, when the electromagnetic member is powered on, the first positioning member and the second positioning member are positioned and matched.

5. The wafer carrying apparatus according to claim 2, further comprising:
   a thimble support; and
   a limit baffle;
   wherein:
      the limit baffle is fixedly arranged in the cavity, a bottom surface of the limit baffle is provided with a plurality of first guide members extending in the vertical direction, and the thimble support is slidably connected with the plurality of first guide members;
      when the edge protection ring lifts to a first position, the transmission member contacts the thimble support; and
      in a process of the transmission member driving the edge protection ring to continue to lift from the first position to a transfer position, the transmission member also drives the thimble support to lift synchronously until the thimble support stops at the limit baffle; and
      in a process of the edge protection ring descending to the process position, the first detection assembly is started and configured to detect the distance.

6. The wafer carrying apparatus according to claim 5, further comprising a second detection assembly, wherein
   the second detection assembly includes a first sensor and a second sensor, the first sensor and the second sensor are arranged at intervals along a moving direction of the thimble support;
   when the thimble support contacts the limit baffle, the first sensor is triggered; and
   when the thimble support is located at the first position, the second sensor is triggered.

7. The wafer carrying apparatus according to claim 5, further comprising a second positioning assembly, wherein:
   the second positioning assembly includes a third positioning member and a fourth positioning member, the third positioning member is arranged on the thimble support, and the fourth positioning member is arranged on the transmission member; and
   when the thimble support contacts the limit baffle, the third positioning member and the fourth positioning member are positioned and matched, such that the transmission member drives the thimble support and the protection ring support to synchronously lower to the first position.

8. The wafer carrying apparatus according to claim 2, further comprising a telescopic sealing member and at least one second guide member, wherein:
   the telescopic sealing member is sleeved on the outside of the adapter, one end of the telescopic sealing member is sealed and connected to the bottom plate, the other end of the telescopic sealing member is connected to the adapter, the at least one second guide member is disposed between the bottom plate and the protection ring support, and the protection ring support moves relative to the bottom plate along the second guide member in the vertical direction.

9. The wafer carrying apparatus according to claim 2, further comprising a cylinder guide member and at least one third guide member, wherein:
   the cylinder guide member and the at least one third guide member are both arranged on the bottom plate and are respectively located on both sides of the cylinder, and the cylinder drives the transmission member to move along the cylinder guide member and the at least one third guide member.

10. The wafer carrying apparatus according to claim 2, wherein:
   the drive assembly further includes a first throttle valve and a second throttle valve, the first throttle valve is arranged in a first gas channel of the cylinder, and the second throttle valve is arranged in a second gas channel of the cylinder; and/or
   the drive assembly further includes a first flow limiting gasket and a second flow limiting gasket, the first flow limiting gasket is arranged in the first gas channel, and the second flow limiting gasket is arranged in the second gas channel.

11. The wafer carrying apparatus according to claim 1, wherein:
   the first detection assembly includes a first photoelectric sensor, a first signal processor, a second photoelectric sensor, and a second signal processor;
   one of two faces of the protection ring support opposite to the base is provided with the first signal processor, and the other is provided with the second signal processor;
   the first photoelectric sensor is provided on the first signal processor and the two are electrically connected, and the second photoelectric sensor is provided on the second signal processor and the two are electrically connected; and
   the first photoelectric sensor and the second photoelectric sensor are arranged staggered, the first signal processor is used to reflect a light emitted by the second photoelectric sensor, and the second signal processor is used to reflect a light emitted by the first photoelectric sensor.

12. A semiconductor process device, comprising a wafer carrying apparatus, wherein the wafer carrying apparatus includes:
   a base;
   an edge protection ring assembly;
   a first detection assembly; and
   a drive assembly;
   wherein:
      the base is used to carry a wafer and includes a cavity internally, the edge protection ring assembly includes an edge protection ring, a protection ring support, and a plurality of protection ring connection rods, the edge protection ring is arranged above the base, the protection ring support is arranged below the base at intervals, and the plurality of protection ring connection rods are connected between the protection ring support and the edge protection ring;
      the drive assembly is arranged in the cavity and connected to the protection ring support, the drive assembly is used to drive the protection ring support to drive the edge protection ring to move between a wafer transfer position and a process position in a vertical direction through the plurality of protection ring connection rods; and
      the first detection assembly is used to detect a distance between the protection ring support and the base in the vertical direction, to control the drive assembly to drive the protection ring support to move according to the distance for adjusting the process position of the edge protection ring when the base carries the wafer.

* * * * *